(12) United States Patent
Yamada

(10) Patent No.: US 7,087,990 B2
(45) Date of Patent: Aug. 8, 2006

(54) POWER SEMICONDUCTOR DEVICE

(75) Inventor: Junji Yamada, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 785 days.

(21) Appl. No.: 09/954,149

(22) Filed: Sep. 18, 2001

(65) Prior Publication Data

US 2002/0140078 A1  Oct. 3, 2002

(30) Foreign Application Priority Data

Apr. 3, 2001  (JP)  ............................. 2001-105046

(51) Int. Cl.
  *H01L 23/48*  (2006.01)
(52) U.S. Cl. ................. 257/693; 257/E23.01
(58) Field of Classification Search ................ 257/690, 257/691, 692, 693, 698, 700, 707, 390, 678; 174/52.1, 52.5, 263, 54, 59, 61, 65 R, 135, 174/73.1
  See application file for complete search history.

(56) References Cited

U.S. PATENT DOCUMENTS

| | | |
|---|---|---|
| 5,446,318 A | 8/1995 | Koike et al. |
| 5,559,374 A | 9/1996 | Ohta et al. |
| 5,585,672 A | 12/1996 | Koike et al. |
| 6,255,585 B1 * | 7/2001 | Jones et al. ................. 174/52.1 |
| 6,320,258 B1 * | 11/2001 | Mangiagli et al. ........... 257/730 |

FOREIGN PATENT DOCUMENTS

| | | |
|---|---|---|
| DE | 43 30 070 A1 | 3/1994 |
| DE | 199 14 741 A1 | 10/2000 |
| EP | 0 752 720 A2 | 1/1987 |
| EP | 1 009 026 A2 | 6/2000 |
| JP | 62-202548 | 9/1987 |
| JP | 406204398 A * | 7/1994 |
| JP | 7-58282 | 3/1995 |
| JP | 08306859 A | 11/1996 |

\* cited by examiner

*Primary Examiner*—B. William Baumeister
*Assistant Examiner*—Dana Farahani
(74) *Attorney, Agent, or Firm*—Oblon, Spivak, McClelland, Maier & Neustadt, P.C.

(57) ABSTRACT

A power semiconductor device to which a large current can be applied and which can be fabricated compactly in a shorter time, including an electrode structure for taking out electrodes from a power semiconductor element mounted on one of a plurality of circuit patterns formed on an insulating substrate inside of a case up to an external-connection terminal exposed outside of the case, and an external-connection terminal insert-formed on the body of the case, exposed to the outside of the case at one end of the terminal and having a junction portion at its other end joined to a circuit pattern different from the circuit pattern on which the power semiconductor element is mounted. The junction portion is directly connected with the power semiconductor element through a wire member bonded to the face opposite to the junction face of the terminal.

6 Claims, 4 Drawing Sheets

POWER SEMICONDUCTOR DEVICE

BACKGROUND OF THE INVENTION

The present invention relates to a power semiconductor device.

A power semiconductor device for controlling and converting a high voltage and a large current has been recently widely used in the power electronics field including power, transportation, and home electric appliances and it is requested to further improve the performance of the device and further decrease the size of the device. Therefore, research and development have been positively performed in order to meet the above requests.

FIGS. 7 and 8 are a top view and a sectional view respectively, showing the internal structure of a conventional power semiconductor device. In case of the power semiconductor device 40, a plurality of circuit patterns 43, 44, and 45 are formed on the upper faces of insulating substrates 41 and 42 and moreover, a plurality of power semiconductor devices 46 are mounted on the upper face of the circuit pattern 44. Wires 47 and 48 are connected between the electrode of each semiconductor element 46 and the circuit pattern 43 and between the circuit patterns 44 and 45.

Moreover, the power semiconductor device 40 has electrode terminals 50 and 51 insert-formed in a case 49 as external-connection terminals and these terminals 50 and 51 are connected to the circuit patterns 43 and 45 through wires 52 and 53 respectively.

As shown in FIG. 8, the lower end of the case 49 is bonded to the circumference of a metallic base 54 on whose upper face the insulating substrates 41 and 42 are provided. Though not illustrated, resin is injected into the case 49 to seal each component in the case 49. In case of the power semiconductor device 40, the current applied to the electrode terminal 50 is supplied to the semiconductor element 46 via the wire 52, the circuit pattern 43 on the insulating substrate 41, and the wire 47, controlled by the semiconductor element 46, and then moreover supplied to the electrode terminal 51 via the circuit pattern 44, wire 48, circuit pattern 45, and wire 53.

However, to supply a large current to the circuit patterns 43 and 45 formed on the insulating substrates 41 and 42 of the conventional power semiconductor device 40 having the above structure, there are problems that it is necessary to increase the widths of the circuit patterns 43 and 45 and thereby, the device increases in width. Moreover, because bonding wires 52 and 53 are connected between the electrode terminal 50 and circuit pattern 43, and between the electrode terminal 51 and circuit pattern 45 respectively, there are problems that many wires are necessary and the time required for wire-bonding increases in order to supply a large current between them.

It is therefore an object of the present invention to provide a power semiconductor device to which a large current can be applied and which can be compactly and more simply fabricated.

SUMMARY OF THE INVENTION

In an aspect of the present invention, there is provided a power semiconductor device with an electrode structure for taking out electrodes from a power semiconductor element mounted on one of a plurality of circuit patterns formed on an insulating substrate inside of a case up to an external-connection terminal exposed outside of the case, in which the external-connection terminal is insert-formed on the case and exposed at its one end and joined at its other end to a circuit pattern different from a circuit pattern on which the power semiconductor element is mounted, and connected with the power semiconductor element through a wire member bonded to the face opposite to the junction face of the terminal. Wire member may be bonded to an external-connection terminal in an area in which the terminal connection terminal is joined to a circuit pattern. Furthermore, the external-connection terminal may be discontinuously connected to the circuit pattern. Furthermore, said external-connection terminal and the circuit pattern may be joined by a conductive material at a part of the junction face between them, and insulated from each other at remaining parts of the junction face.

Furthermore, the external-connection terminal may have a size smaller than the surface of the circuit pattern at the face to be joined to the circuit pattern. Furthermore, the external-connection terminal may have a size larger than the surface of the circuit pattern at the face to be joined to the circuit pattern.

DETAILED DESCRIPTION OF THE INVENTION

Embodiments of the present invention are described below while referring to the accompanying drawings.

FIRST EMBODIMENT

Figure 1:
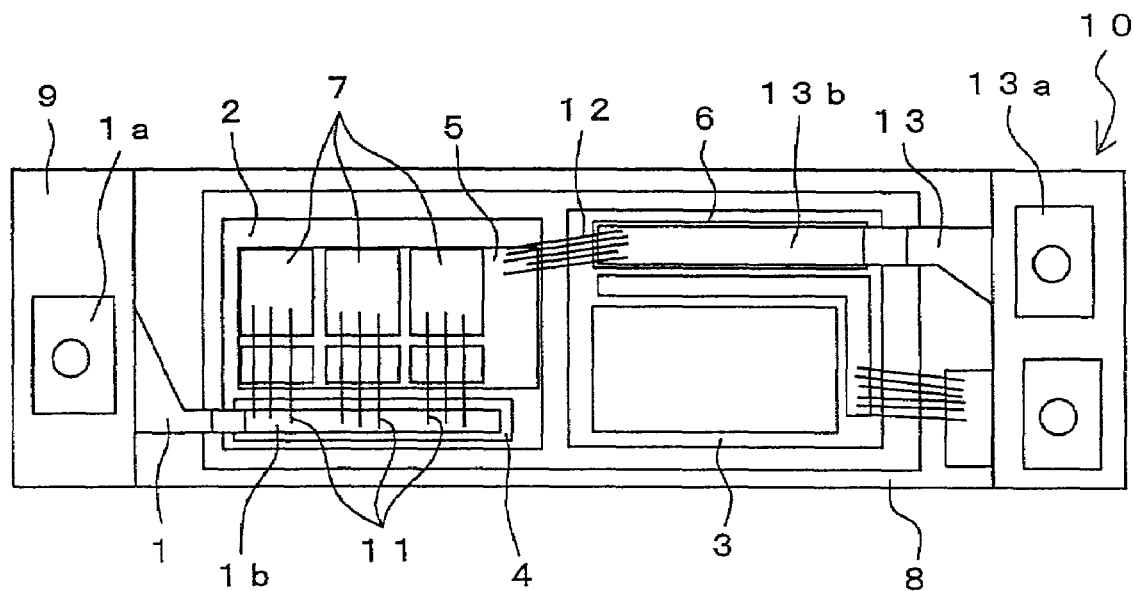
FIG. 1 is a top view showing an internal structure of a power semiconductor device of first embodiment of the present invention.
Figure 2:
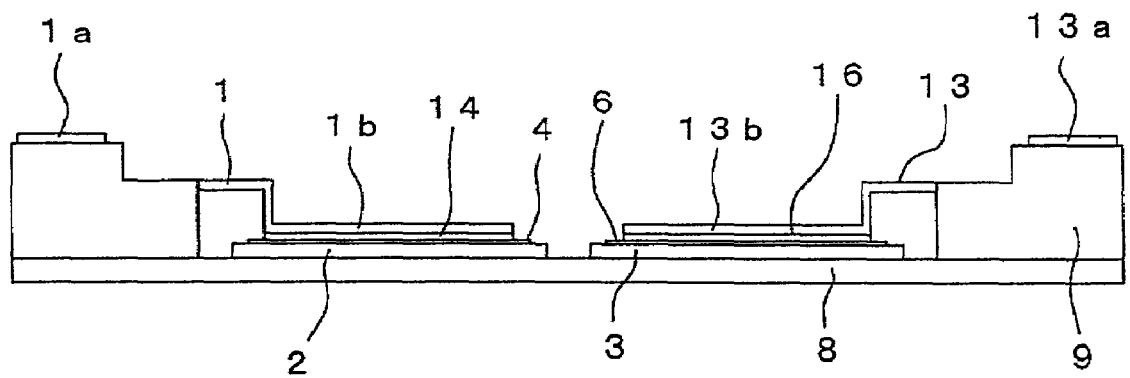
FIG. 2 is a sectional view showing the internal structure of the power semiconductor device in FIG. 1.

FIGS. 1 and 2 are a top view and a sectional view showing the internal structure of the power semiconductor device of first embodiment of the present invention. The power semiconductor device 10 has a structure in which a power semiconductor element 7 and its circumferential electrode wirings are formed on a metallic base 8 and enclosed by an outer case 9 and components in the case 9 are sealed with resin. In the outer case 9, first and second insulating substrates 2 and 3 are provided on the metallic base 8 and first and second circuit patterns 4 and 5 are formed on the first insulating substrate 2 while a third circuit pattern 6 is formed on the second insulating substrate 3. A plurality of power semiconductor elements 7 (three elements for this embodiment) are mounted on the second circuit pattern 5.

In case of first embodiment, first and second external-connection terminals 1 and 13 are insert-molded into a case 9 and exposed to the outside of the case at their one ends while they are joined at their other ends to a circuit pattern different from the second circuit pattern 5 on which the power semiconductor element 7 is mounted. Specifically, the first external-connection terminal 1 is joined to the first circuit pattern 4 through a conductive junction material 14 and the second external-connection terminal 13 is joined to the third circuit pattern 6 through a conductive junction material 16. In FIGS. 1 and 2, the external exposed portion and junction portion of the first external-connection terminal 1 are denoted by 1a and 1b respectively, and the exposed portion and junction portion of the second external-connection terminal 13 are denoted by 13a and 13b respectively.

As shown in FIG. 2, the first and second external-connection terminals 1 and 13 are stepwise formed as a whole and these exposed portions 1a and 13a and junction portions 1b and 13b are fixed to the case 9 so as to extend parallel with the metallic base 8. Moreover, a plurality of wires 11 are bonded to the face (that is, upper face) opposite to the junction face of the terminal 1 and the terminal 1 is connected with the power semiconductor element 7 through these wires 11. Moreover, a plurality of wires 12 are bonded to the face (that is, upper face) opposite to the junction face of the junction portion 13b of the second external-connection terminal 13 and the terminal 13 is connected to the second circuit pattern 5 through these wires 12.

In case of the power semiconductor device 10 with above configuration, the current applied to the exposed portion 1a of the external-connection terminal 1 flows through the junction portion 1b of the terminal 1 and is supplied to the first circuit pattern 4 joined with the junction portion 1b. The current is further led to the power semiconductor element 7 mounted on the second circuit pattern 5 via the wires 11 and current-controlled by the semiconductor element 7, and then supplied to the electrode terminal 13 via the second circuit pattern 5 and the wires 12.

Moreover, in case of first embodiment, the junction portion 1b of the first external-connection terminal 1 has a size smaller than the surface of the first circuit pattern 4. In this case, it is possible to moderate the stress caused by the thermal-expansion difference between the first circuit pattern 4 and the junction portion 1b of the external-connection terminal 1. As a result, it is possible to improve the reliability of the device 10.

Figure 3:
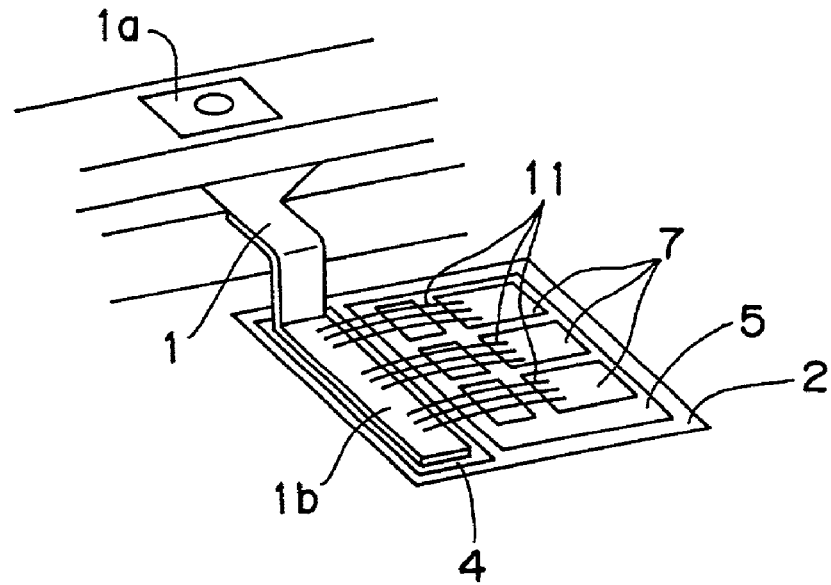
FIG. 3 is an enlarged perspective view showing an external-connection terminal of the power semiconductor device in FIG. 1.

FIG. 3 is an enlarged perspective view of the first external-connection terminal 1 in the power semiconductor device 10. As shown in FIG. 3, the wires 11 for connecting the power semiconductor elements 7 with the external-connection terminal 1 is bonded to the external-connection terminal 1 within an area in which the wires 11 are joined to the first circuit pattern 4, that is, at the junction portion 1b. In this case, movement at the junction portion 1b of the first external-connection terminal 1 is prevented and thereby, the bonding strengths of the wires 11 can be improved. Moreover, in this case, because the junction portion 1b is horizontal, it is possible to reduce the fluctuation of the bonding strengths under bonding process.

As described above, by directly joining the first and second external-connection terminals 1 and 13 insert-molded into the case 9 to the first and third circuit patterns 4 and 6 formed on the first and second insulating substrates 2 and 3 in the case 9, it is possible to easily fabricate a structure to which a large current can be supplied without bonding many wires. Moreover, in this case, because there are not any wires to be bonded to the first and third circuit patterns 4 and 6, it is possible to set the planar dimensions of the first and third circuit patterns 4 and 6 to small values. As a result, it is possible to provide a compact power semiconductor device 10 having a large current capacity.

Moreover, because the first and second external-connection terminals 1 and 13 are joined onto the first and third circuit patterns 4, it is unnecessary to form junction patterns for the external-connection terminals 1 and 13 on the insulating substrates 2 and 3 and it is possible to reduce the device 10 in size and cost.

Then, another embodiment of the present invention is described below. In the following description, the same components as in first embodiment are denoted by the same numerals and their explanations are omitted.

SECOND EMBODIMENT

Figure 4:
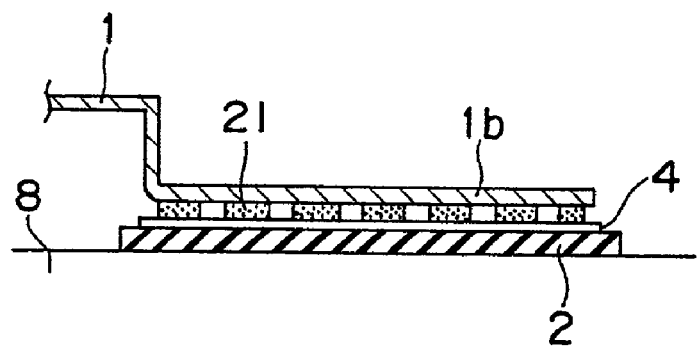
FIG. 4 is an enlarged sectional view showing a connective structure of an external-connection terminal of a power semiconductor device of second embodiment of the present invention.

FIG. 4 is an enlarged sectional view of a first external-connection terminal 1 in a power semiconductor device 10 of second embodiment of the present invention. In case of second embodiment, the first external-connection terminal 1 is joined to a first circuit pattern 4 by a discontiguous conductive junction material 21 at the junction portion 1b of the terminal 1. Thereby, junction of the external-connection terminal 1 to the circuit pattern 4 becomes discontiguous and it is possible to moderate the stress caused by the thermal-expansion difference between the circuit pattern 4 and the first external-connection terminal 1. As a result, it is possible to improve the reliability of the device.

It is noted that only the first external-connection terminal 1 is described herein, however, this feature can be also applied to the junction structure of a second external-connection terminal 13.

THIRD EMBODIMENT

Figure 5:
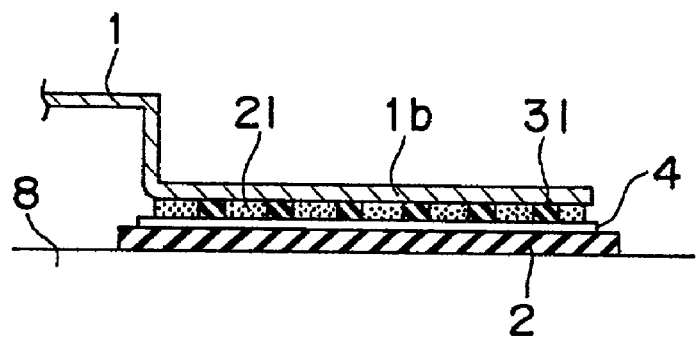
FIG. 5 is an enlarged sectional view of a connective structure of an external-connection terminal in a power semiconductor device of third embodiment of the present invention.

FIG. 5 is an enlarged sectional view of a connection structure of an external-connection terminal in the power semiconductor device of third embodiment of the present invention. In case of third embodiment, said first external-connection terminal 1 and said first circuit pattern 4 are joined by a insulating material 31 at a part of the junction face between them, and joined by a conductive material 21 at remaining parts of the junction face. Thus, by limiting the electrical connective portion between the circuit pattern 4 and the external-connection terminal 1, it is possible to easily detect a voltage at the circuit pattern 4 independently of the current circulating through the external-connection terminal 1.

It is noted that, in above description, the electrical connective portion between the circuit pattern 4 and the external-connection terminal 1 is limited by using the insulating material 31, however, it is also permitted to use air insulation instead of the insulating material 31. Furthermore, in above description, only the first external-connection terminal 1 is described herein, however, this feature can be also applied to the junction structure of a second external-connection terminal 13.

FOURTH EMBODIMENT

Figure 6:
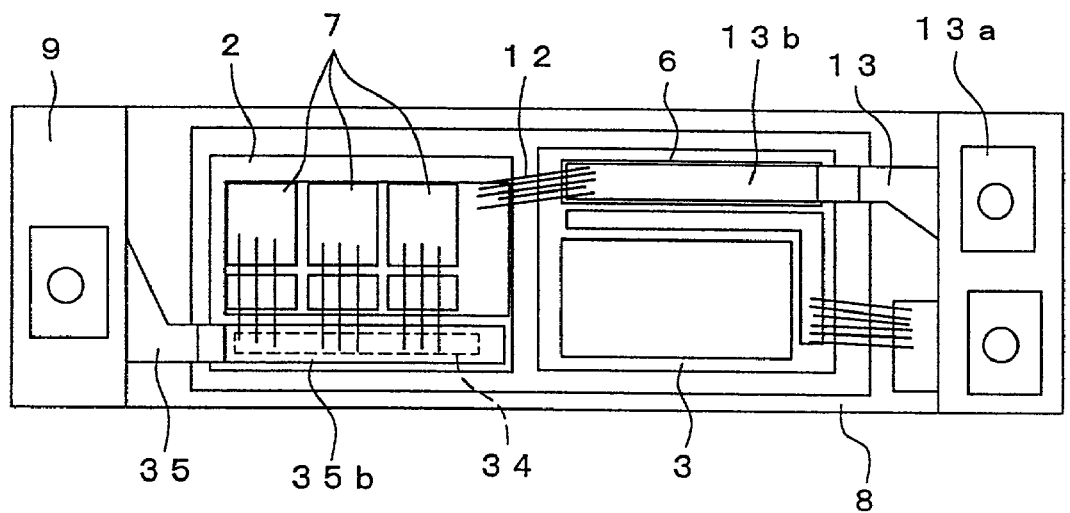
FIG. 6 is a top view showing an internal structure of a power semiconductor device of fourth embodiment of the present invention.
Figure 7:
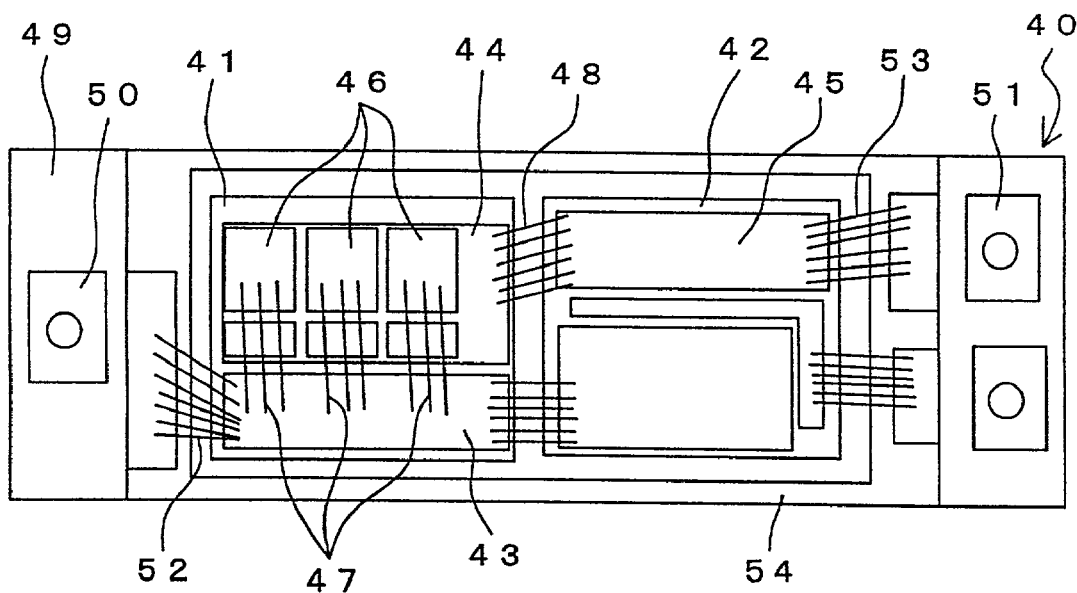
FIG. 7 is a top view showing an internal structure of a conventional power semiconductor device.
Figure 8:
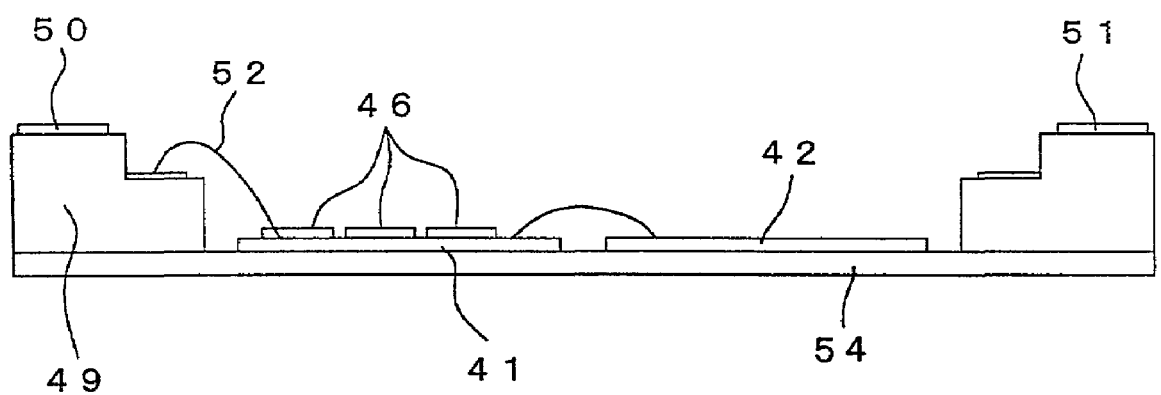
FIG. 8 is a sectional view showing the internal structure of the conventional power semiconductor device in FIG. 7.

FIG. 6 is a top view showing the internal structure of the power semiconductor device of fourth embodiment of the present invention. In case of this fourth embodiment, a first external-connection terminal 41 has a size larger than the surface of a circuit pattern 44 at a portion 41b joined to the circuit pattern 44. In this case, it is possible to apply a larger current to the external-connection terminal 41.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A power semiconductor device with an electrode structure for taking out electrodes from a power semiconductor element mounted on one of a plurality of first circuit patterns formed on an insulating substrate inside of a case up to an external-connection terminal exposed outside of the case, wherein
the external-connection terminal is insert-molded into the case and exposed outside of the case at one end of the terminal while the terminal includes a junction portion having a junction face joined at its other end to a second circuit pattern different from the first circuit pattern on which the power semiconductor element is mounted and directly connected with the power semiconductor element through a wire member bonded to the face opposite to the junction face of the terminal junction portion.

2. The power semiconductor device according to claim 1, wherein the wire member is bonded to an external-connection terminal in an area in which the external-connection terminal is joined to a circuit pattern.

3. The power semiconductor device according to claim 1, wherein the external-connection terminal is discontinuously joined to the circuit pattern.

4. The power semiconductor device according to claim 1, wherein said external-connection terminal and the second circuit pattern are joined by a conductive material at a part of the junction face between them, and insulated from each other at remaining parts of the junction face.

5. The power semiconductor device according to claims 1, wherein the external-connection terminal has a size smaller than the surface of the second circuit pattern on the junction face to be joined to the second circuit pattern.

6. The power semiconductor device according to claim 1, wherein the external-connection terminal has a size larger than the surface of the second circuit pattern on the junction face to be joined to the circuit pattern.

* * * * *